United States Patent [19]

Neu

[11] Patent Number: 5,149,994
[45] Date of Patent: Sep. 22, 1992

[54] METHOD AND APPARATUS FOR COMPENSATING INHERENT NON-UNIFORMITY OF ELECTRICAL PROPERTIES AMONG MOS INTEGRATED CIRCUITS

[75] Inventor: Georges Neu, Mariel sur Mauldre, France

[73] Assignee: Bull S.A., Paris, France

[21] Appl. No.: 625,945

[22] Filed: Dec. 11, 1990

[30] Foreign Application Priority Data

Dec. 15, 1989 [FR] France .................................. 89 16596

[51] Int. Cl.$^5$ .............................................. H03F 1/30
[52] U.S. Cl. .................................. 307/491; 307/296.6; 307/362
[58] Field of Search ............... 307/491, 571, 296.1, 307/296.6, 296.8, 362, 363; 323/312–316; 330/9

[56] References Cited

U.S. PATENT DOCUMENTS

| | | | |
|---|---|---|---|
| 4,260,946 | 4/1981 | Wheatley | 307/296.6 |
| 4,446,444 | 5/1984 | Patterson, III | 330/264 |
| 4,616,142 | 10/1986 | Upadhyay | 307/296.1 |
| 4,806,875 | 2/1989 | Schaffer | 330/9 |
| 4,835,417 | 5/1989 | Kousaka | 307/362 |
| 4,896,059 | 1/1990 | Goodwin-Johansson | 307/363 |
| 4,906,914 | 3/1990 | Ohsawa | 307/296.6 |
| 4,954,728 | 9/1990 | Pavlin | 307/491 |
| 5,010,338 | 4/1991 | Miki | 307/362 |

FOREIGN PATENT DOCUMENTS

| | | |
|---|---|---|
| 0256729 | 2/1988 | European Pat. Off. . |
| 2550107 | 5/1976 | Fed. Rep. of Germany . |
| 3119516 | 12/1982 | Fed. Rep. of Germany . |
| 1460605 | 1/1977 | United Kingdom . |
| 1533231 | 11/1978 | United Kingdom . |

Primary Examiner—Eugene R. LaRoche
Assistant Examiner—A. Zarabian
Attorney, Agent, or Firm—Weingarten, Schurgin, Gagnebin & Hayes

[57] ABSTRACT

For use with an inverter including CMOS transistors, a device for compensating inherent variations in electrical properties among MOS integrated circuits, the device including a generator of a reference signal representing conduction of a reference transistor; two threshold amplifiers; two switches; and two compensating transistors. If, for example, a first transistor is weak, switches are employed to selectively activate one or more supplementary transistors to add a compensating current to a current furnished by the first transistor so as to provide a reliably uniform output current as compared with a plurality of other MOS integrated circuits.

11 Claims, 2 Drawing Sheets

5,149,994

METHOD AND APPARATUS FOR COMPENSATING INHERENT NON-UNIFORMITY OF ELECTRICAL PROPERTIES AMONG MOS INTEGRATED CIRCUITS

FIELD OF THE INVENTION

This invention relates to a method and apparatus for compensating for inherent variations in electrical properties in MOS devices due to non-uniformity in materials or manufacturing, and particularly to self-compensation circuits for insuring uniform performance of MOS devices.

BACKGROUND OF THE INVENTION

Present-day methods for manufacture of MOS integrated circuits (ICs) do not yield MOS transistors having the desired uniformity of current/voltage characteristics over a plurality of ICs. Transistors designed to have the same characteristics display substantial non-uniformity of electrical characteristics over a plurality of ICs. For example, at a given voltage, the current in the saturation regime of two purportedly identical transistors may vary by a factor of three or more. However, the characteristics of identical transistors are substantially the same when both are found on a given integrated circuit. Usually, a distinction is made between transistors adapted to carry a stronger current than planned, and weak transistors adapted to carry a weaker current. The deviation of the actual current flowing through a transistor from its intended value, referred to as current drift, can be either positive or negative.

Current drift has undesirable consequences. Assume, for example, that an MOS transistor is commanded to charge or discharge an external bus or an internal line. The bus has an inductance L which conditions noise as a function of variations in the bus current Ib. The noise corresponds to the product L dIb/dt. The inductance L has a predetermined value. For an external bus, it includes the inductance of the parts of the bus in the transmitting and receiving housings, and the inductance of the link between the two housings. The value of the maximum permissible noise thus determines the maximum current intensity Ib. This intensity determines the size of the corresponding transistor. Assume that loading or unloading of the bus by this transistor triggers a threshold device such as a threshold inverter. The inverter will be triggered at the right moment by a typical transistor, at an earlier time by a relatively powerful transistor, and at a later time by a relatively weak transistor. However, a maximum duration is usually required for the operations in the integrated circuit to take place within times determined by a clock signal. If triggering takes place after the required maximum duration, operation will be disturbed and correction processes must be employed. Increasing the current of a weak transistor by increasing its size is impossible. In an integrated circuit with powerful transistors, this increase in size would lead to a current exceeding the maximum permissible value and produce excessive noise. Moreover, technological evolution requires increasingly rapid circuits. Operating speed would be improved if it were possible to effectively and reliably reduce the maximum time taken to command a functional element of the integrated circuit without increasing noise.

SUMMARY OF THE INVENTION

This invention provides a method for compensating for inherent variations in the electrical properties of field effect transistors among a plurality of integrated circuits, including the steps of producing a reference signal representing the conduction of a reference transistor of the integrated circuit, defining a conduction threshold, comparing the reference signal with the conduction threshold, and producing a compensating current if the reference signal does not reach the conduction threshold.

The invention also teaches a device for compensating for inherent variations in the electrical properties of a field effect transistor in an integrated circuit including a switch, and a compensating circuit with at least one current path parallel to that of the field effect transistor and selected by the switch. The device of the invention is preferably embodied as an integrated circuit.

The invention allows operation of an electronic circuit under optimum conditions, independent of variation in electrical properties of MOS transistors due to non-uniformity due to, for example, manufacturing non-uniformity, without increasing noise. The invention also minimizes waiting times for an event in order to effectively and reliably improve the operating speed of an integrated circuit.

The invention can be used in particular in conjunction with binary amplifiers, buffer amplifiers, and clock generators.

DESCRIPTION OF THE DRAWING

The invention will be more fully understood from the following detailed description, in conjunction with the accompanying figures, in which.

In the figures, the N-MOS transistors will be designed by N and the P-MOS transistors by P.

DETAILED DESCRIPTION OF THE INVENTION

Figure 1:
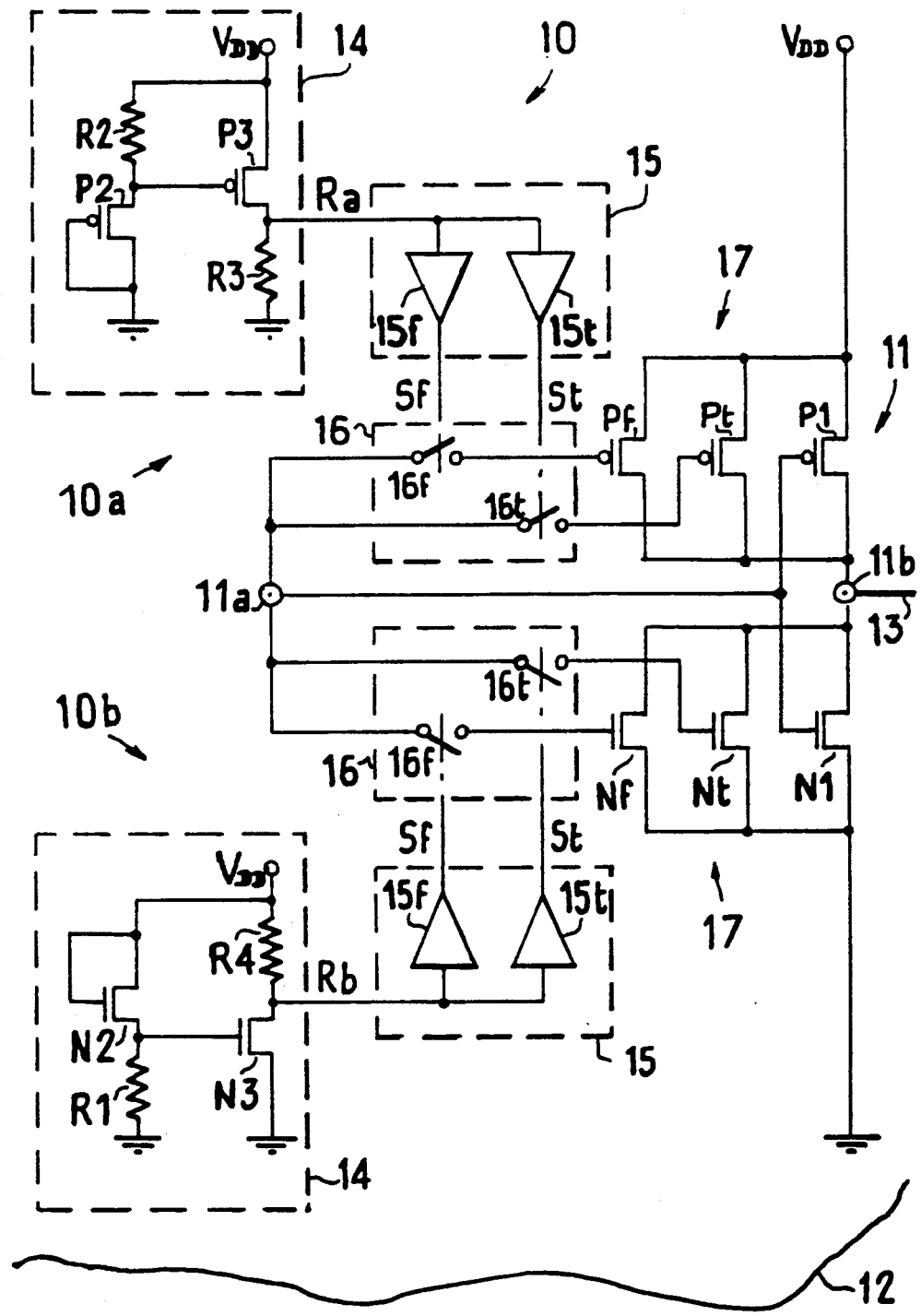
FIG. 1 is a schematic diagram of an inverter of the CMOS type associated with a compensating device according to the invention.

With reference to FIG. 1, a device 10 according to the invention is shown, associated with an inverter 11 in an integrated circuit 12 of the CMOS type. Inverter 11 normally has an input 11a and an output 11b. Output 11b is connected to a bus 13. A classic inverter includes two complementary transistors N1 and P1 mounted in series between ground and the supply voltage VDD. When input 11a is in logic state "0" corresponding to the ground potential, transistor N1 is blocked and transistor P1 conducts. Consequently, bus 13 becomes charged at voltage VDD. When input 11a goes into state "1" corresponding to voltage VDD, transistor P1 becomes blocked and transistor N1 conducts. Consequently, bus 13 discharges through transistor N1. The size of transistors N1 and P1 in their typical state corresponds to the maximum permissible current intensity for the bus. These transistors determine the typical bus charging or discharging time. If, for example, transistor N1 is powerful, the discharging time will be shorter, but a classic inverter composed of the two transistors N1 and P1 will derive no benefit from this. If transistor N1 is weak, the discharge time is longer; perhaps too long for normal operation. The same is true for the charging time of bus 13 through transistor P1. Since field effect transistors of complementary types have different characteristics, their drifts may be different. For example, it is possible, in a given integrated circuit, for N channel transistors to be powerful and P channel transistors to be weak. A complicated situation results, unfavorable to the desired operating speed of an inverter for any integrated circuit.

The invention is for use with, for example, an inverter 11. The compensating device 10 of the invention is composed of two sections 10a, 10b applying respectively to transistors P1 and N1 of inverter 11. In these two sections, the common elements have the same reference numbers. Each section has: a reference generator 14 producing a reference signal R (Ra, Rb); a threshold generator 15 composed of two threshold amplifiers 15t and 15f having respective thresholds Tt and Tf; a switch unit 16 composed of two switches 16t and 16f; and a compensating circuit 17 composed of two current paths composed of the drain-source leads of two transistors Pt and Pf in section 10a, and two transistors Nt and Nf in section 10b.

Reference generator 14 of section 10a has two transistors P2, P3 having their drain-source leads in series with two resistors (R2, R3 respectively) between ground and potential VDD. Transistor P2 has its drain and its gate grounded. Its source is connected to potential VDD through resistor R2 and is connected to the gate of transistor P3. Transistor P3 has its source connected to potential VDD and its drain grounded through resistor R3. The output of reference generator 14 is the drain of transistor P3 which delivers reference signal Ra. This signal is applied to the respective inputs of threshold amplifiers 15t and 15f. Compensating signals St and Sf at the outputs of the threshold amplifiers control switches 16t and 16f, respectively. Each switch is represented schematically in FIG. 1 by a mechanical contact for ease in reading the drawings. Switches 16t and 16f have one terminal connected to the input 11a of inverter 11 and another terminal connected to the respective gates of transistors Pt and Pf. These transistors have their drain-source leads connected in parallel to that of transistor P1.

Figure 2:
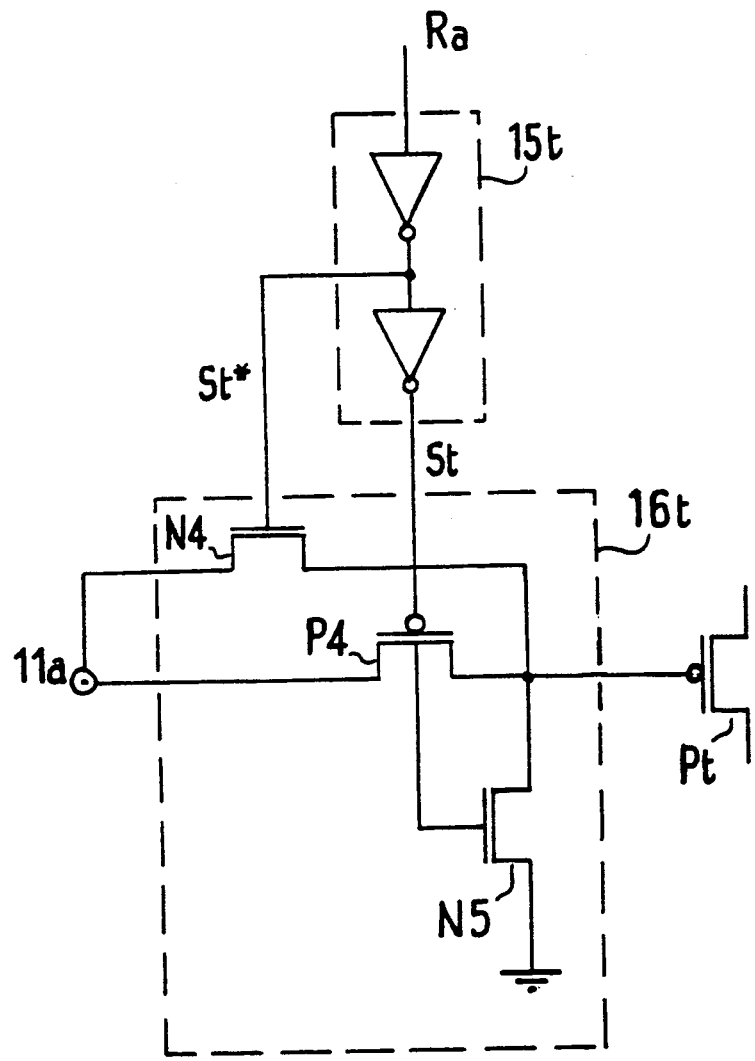
FIG. 2 is a schematic diagram of a CMOS switch associated with an amplifier for the compensation device shown in FIG. 1.

FIG. 2 illustrates a classic embodiment of a CMOS switch usable to form switches 16t and 16f in section 10a. It relates illustratively to switch 16t associated with amplifier 15t. Amplifier 15t is classically composed of a threshold inverter delivering complementary compensating signal St*, followed by an inverter delivering signal St. Switch 16t is composed of three transistors P4, N4, and N5. Transistors P4 and N4 have their drain-source leads in parallel between input 11a and the gate of transistor Pt and are controlled respectively by signals St and St*. Transistor N5 has its source at ground, its drain connected to the gate of transistor Pt, and its gate receiving signal St.

The operation of section 10a of compensating device 10 will now be described. In reference generator 14 it is advantageous to establish a correlation between the current dispersions of the transistors and the dispersions of the resistors. Resistors R2 and R3 are preferably made of polycrystalline silicon in order for the dispersion of the resistors to be negligible by comparison with that of the transistors. Transistor P2, with its gate connected to its drain, constitutes a diode. The operating point of the diode is determined by the value of resistor R2. P2 plus R2 constitutes the polarization circuit of transistor P3. This transistor amplifies the variations in current in transistor P2. If the current of transistor P2 is weak, the voltage at its source is high. Consequently, transistor P3 conducts poorly, so that reference signal Ra at its drain will be weak. On the contrary, if transistor P2 is powerful, reference signal Ra will be high.

Reference signal Ra is then compared to thresholds Tt and Tf of amplifiers 15t and 15f. A value of Ra equal to or less than threshold Tf, characterizes weak P-MOS transistors in integrated circuit 12. An Ra value higher than threshold Tf but equal to or less than threshold Tt, characterizes the existence of typical transistors. Above threshold Tt, transistors are considered powerful. In this case, the two amplifiers 15t and 15f do not react to reference signal Ra. Their output signals are in logic state "0" and leave switches 16t and 16f in the open state. As a result, only transistor P1, considered to be powerful, conducts in inverter 11 if the signal at input 11a is in state "0". If reference signal Ra indicates the presence of typical P-MOS transistors, only amplifier 15t is active. Its output signals St and St*, shown in FIG. 2, close switch 16t. Transistor Pt then receives the signal from input 11a of inverter 11. If this signal is in state "0", transistors P1 and Pt conduct. If reference signal Ra corresponds to weak transistors, the two amplifiers 15t and 15f are active and cause transistors Pt and Pf to conduct, in addition to transistor P1, if input 11a is in state "0".

Thus, the method according to the invention consists of producing a reference signal Ra representing conduction of reference transistor P2 of integrated circuit 12, defining a conduction threshold Tt, comparing the reference signal with the conduction threshold, and producing a compensating current if the reference signal does not reach the conduction threshold. In the previous example, a second conduction threshold Tf improves the performance of the method. Moreover, production of the compensating current consists of adding an additional current to the current of field effect transistor P1.

Another feature of the invention relates to determining the intensity of the compensating current. For purposes of illustration, the average intensities of powerful, typical, and weak transistors will be designated Ip, It, and If respectively, assuming that, according to statistics, Ip = 3It/2 and that If = 2It/3. In other words, It = 1.5.If and Ip = 2.25.If. By dimensioning transistors Pt and Pf to be traversed by the same current which is half that traversing transistor P1, the intensity Ib of the current in bus 13 is equal to Ip for powerful transistors in section 10a; for typical transistors, Ib = It + It/2 = 3It/2; and for weak transistors, Ib = If + If/2 + If/2 = 2If. Using the above assumptions, these equations become: for powerful transistors, Ib = 2.25.If; for typical transistors, Ib = 2.25.If; and for weak transistors, Ib = 2.If. Thus, by controlling the current passing through transistors Pt and Pf, a substantially compensated current in bus 13, independent of non-uniformity of the electrical properties of the P-MOS transistors in integrated circuit 12.

Section 10b of device 10 applies the same principle to the N-MOS transistors of integrated circuit 12. Briefly stated, reference generator 14 has two transistors N2 and N3 and two resistors R1, R4. Transistor N2 has its drain and its gate connected to potential VDD. Its source is grounded through resistor R1 and is applied to the gate of transistor N3. The source of transistor N3 is grounded and its drain is connected to potential VDD through resistor R4. Reference signal Rb at the drain of transistor N3 is applied to the inputs of the two threshold amplifiers 15t and 15f. Their output signals St, St*, and Sf, Sf* command the activation of the two switches 16t and 16f relative to compensating transistors Nt and Nf.

Numerous variants of the example described may be made. In particular, a single threshold can suffice in some cases. However, others could be added. Moreover, the compensating currents in the example described are additive and have a cumulative effect with the main current in P1 or N1. However, switching could be noncumulative. For example, switch 16 could disconnect transistor P1 and connect transistor Pt, dimensioned to conduct a current Ib=2.25.If. Another embodiment of the method according to the invention could also consist of eliminating reference generators 14. The method would consist, before utilization of integrated circuit 12, of measuring the current passing through a P-MOS transistor and an N-MOS transistor of the integrated circuit, and comparing it with at least one threshold. The result of the comparison could be introduced into a register of the integrated circuit. The contents of the register would represent the compensating signal. It would be introduced when the integrated circuit processing system was initialized. The result of the comparison could also be introduced into erasable ROM, for example. More simply, compensating device 10 could include compensating circuits 17 and switches 16 only if, for example, closed selectively by laser.

The invention has the advantage of equalizing the current in bus 13 at the best intensity possible. Inverter 11 thus offers the best possible performances, regardless of the current drifts of its transistors. As a result, there is a substantial improvement in propagation time. Since this time is practically constant, integrated circuit 12 can operate more rapidly. This advantage is obtained with no increase in the noise representing the inductive component of the bus. This noise is usually known as "slew rate." Moreover, regulation of the rise and fall time of the transmitted signal results in a substantial improvement in the bus transmission passband. It should also be noted that the additional elements of the device according to the invention can be common to other inverters or other components of the integrated circuit.

It is clear that the invention can apply to components other than an inverter. For example, its characteristics may benefit a clock generator. Because of the invention, the rise and fall times are smaller and constant, regardless of drifts. The clock can be faster and the waiting time for a event (skew) shorter. It is also obvious that the invention can be applied in simple MOS, in CMOS, and in BiCMOS. In the latter case, the effects of the invention will be amplified by the action of bipolar transistors, since the current furnished by each compensating circuit 17 is supplied to the base of a bipolar transistor.

Other modifications will occur to those skilled in the art without departing from the spirit and the scope of the invention as claimed. Accordingly, the above description is not intended to limit the invention except as indicated in the following claims.

What is claimed is:

1. A method for compensating inherent non-uniformity of the electrical properties of a field effect transistor in an integrated circuit amount a plurality of integrated circuits so as to provide constant output current, the method comprising the steps of:

producing a reference signal (Ra) representing conduction of a reference transistor (P2) of the integrated circuit;
defining a constant conduction threshold (Tt, Tf);
comparing the reference signal with the conduction threshold; and
producing a compensating current if the reference signal does not reach the conduction threshold so as to provide substantially constant output current.

2. The method of claim 1 wherein the step of producing the compensating current include the step of adding a current to the current of the field effect transistor.

3. The method of claim 1 wherein the step of producing the compensating current includes the step of selecting a lead producing said compensating current.

4. Apparatus for compensating inherent non-uniformity of the electrical properties of a field effect transistor (P1) in an integrated circuit (12) among a plurality of integrated circuits so as to provide a constant output current, producing a reference signal (Ra) representing conduction of a reference transistor (P2) of the integrated circuit;
defining a conduction threshold (Tt, Tf);
comparing the reference signal with the conduction threshold; and
producing a compensating current if the reference signal does not reach the conduction threshold the apparatus comprising:
a reference circuit for producing a reference signal representing conduction of a reference transistor of the integrated circuit;
a threshold circuit, responsive to the reference signal, for providing at least one constant threshold;
a switch (16), responsive to the threshold circuit; and
a compensating circuit (17), controlled by the switch, the compensating circuit comprising at least one current path (Pt, Pf) parallel to that of field effect transistor (P1) and selected by the switch.

5. The apparatus of claim 4 wherein said switch (16) includes at least one physical link (16t, 16f) which is adapted to be closed by exposure to light emitted by a laser.

6. The apparatus of claim 4 wherein said switch (16) includes at least one electronic switch (16t, 16f).

7. The apparatus of claim 6 wherein said switch (16) is controlled by a compensating signal (St, Sf) generator.

8. The apparatus of claim 7 wherein said compensating signal generator is a memory or register of integrated circuit (12).

9. The apparatus of claim 7 wherein said compensating signal generator is a threshold amplifier (15) receiving a reference signal (Ra) representing conduction of a reference transistor (P2) of the integrated circuit.

10. The apparatus of claim 4, wherein said apparatus is fabricated as part of an integrated circuit (12)

11. Apparatus for compensating inherent non-uniformity of the electrical properties of a PMOS field effect transistor and an NMOS field effect transistor, each residing on an integrated circuit among a plurality of integrated circuits so as to provide a substantially constant output current, the apparatus comprising:

a PMOS reference circuit for producing a PMOS reference signal representing conduction of a reference PMOS transistor of the integrated circuit;

an NMOS reference circuit for producing an NMOS reference signal representing conduction of a reference NMOS transistor of the integrated circuit;

a first threshold circuit, responsive to the PMOS reference signal, for providing at least one constant threshold;

a second threshold circuit, responsive to the NMOS reference signal, for providing at least one constant threshold;

a first switch, responsive to the first threshold circuit;

a second switch, responsive to the second threshold circuit;

a first compensating circuit, controlled by the first switch, the first compensating circuit comprising at least one current path parallel to that of the PMOS field effect transistor and selected by the first switch; and a second compensating circuit, controlled by the second switch, the second compensating circuit, comprising at least one current path parallel to that of the NMOS field effect transistor and selected by the second switch.

* * * * *